(12) United States Patent
Zhang

(10) Patent No.: US 11,658,509 B2
(45) Date of Patent: May 23, 2023

(54) SEQUENCE CONTROL CIRCUIT FOR ENHANCING RELIABILITY IN CASE OF ABNORMAL POWER-DOWN AND CONTROL METHOD THEREOF

(71) Applicant: INSPUR SUZHOU INTELLIGENT TECHNOLOGY CO., LTD., Jiangsu (CN)

(72) Inventor: Songtao Zhang, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 17/796,093

(22) PCT Filed: Feb. 19, 2021

(86) PCT No.: PCT/CN2021/076833
§ 371 (c)(1),
(2) Date: Jul. 28, 2022

(87) PCT Pub. No.: WO2022/021848
PCT Pub. Date: Feb. 3, 2022

(65) Prior Publication Data
US 2023/0085226 A1 Mar. 16, 2023

(30) Foreign Application Priority Data
Jul. 25, 2020 (CN) .......................... 202010726259.X

(51) Int. Cl.
*H02J 9/06* (2006.01)
*H03K 19/20* (2006.01)

(52) U.S. Cl.
CPC .............. *H02J 9/061* (2013.01); *H03K 19/20* (2013.01)

(58) Field of Classification Search
CPC ................................. H02J 9/061; H03K 19/20
(Continued)

(56) References Cited

U.S. PATENT DOCUMENTS

| 5,051,609 | A | 9/1991 | Smith | |
|---|---|---|---|---|
| 2013/0305207 | A1* | 11/2013 | Hsieh | .................... G06F 30/367 |
| | | | | 716/136 |

FOREIGN PATENT DOCUMENTS

| CN | 103138716 A | 6/2013 |
|---|---|---|
| CN | 109907378 A | 6/2019 |
| CN | 111917399 A | 11/2020 |

OTHER PUBLICATIONS

International Search Report of corresponding PCT application PCT/CN2021/076833, dated May 19, 2021, 6 pgs.
(Continued)

*Primary Examiner* — Michael R. Fin
(74) *Attorney, Agent, or Firm* — Cooper Legal Group, LLC

(57) ABSTRACT

The control circuit includes a signal indication circuit, a control/isolation circuit, and an energy storage circuit; the signal indication circuit is a logic AND gate circuit, has an input end connected to multiple paths of power-down monitoring signals and an output end connected to an input end of the control/isolation circuit, and when a level of any path of power-down monitoring signal is low, outputs a low level to the control/isolation circuit; an output end of the control/isolation circuit is connected to an enable end of a Direct Current (DC) power chip, and the control/isolation circuit controls and isolates an output signal of the signal indication circuit by means of two-stage Metal-Oxide-Semiconductor (MOS) transistors; and an output end of the energy storage circuit is connected to the control/isolation circuit to provide reserve power for operation of the MOS transistors of the control/isolation circuit.

20 Claims, 3 Drawing Sheets

(58) Field of Classification Search
USPC .......................................................... 307/66
See application file for complete search history.

(56) References Cited

OTHER PUBLICATIONS

Written Opinion of International Searching Authority of corresponding PCT application PCT/CN2021/076833, dated May 19, 2021, 9 pgs.

* cited by examiner

SEQUENCE CONTROL CIRCUIT FOR ENHANCING RELIABILITY IN CASE OF ABNORMAL POWER-DOWN AND CONTROL METHOD THEREOF

This application claims priority to Chinese Patent Application No. 202010726259.X, filed on Jul. 25, 2020, in China National Intellectual Property Administration and entitled "Sequence Control Circuit for Enhancing Reliability in Case of Abnormal Power-Down and Control Method Thereof", which is hereby incorporated by reference in its entirety.

FIELD

Embodiments of the present disclosure relate to the field of server system design, and particularly to a sequence control circuit for enhancing reliability in case of abnormal power-down and a control method thereof.

BACKGROUND

With the rise of big data, cloud computing, artificial intelligence, and other technologies, demands for server increase, and correspondingly, requirements for servers also increase. Applications of servers become increasingly common, no more limited to large server data centers but gradually extended to computer rooms of large, medium, and small-sized enterprises, and application environments of servers also become more and more complex. In daily use of a server, sometimes there may be an emergency such as a power failure. In this emergency, the server generally cannot be shut down normally, but is shut down due to abnormal power-down caused by sudden power-down of a Power Supply Unit (PSU).

In existing server power supply, a voltage output to a main board by a PSU may drop directly in case of abnormal power-down of the PSU. Since the voltage drops within short time, the main board cannot execute a shutdown sequence normally, and furthermore, abnormal power-down occurs to all Direct Current (DC) power supplies on the main board. In case of abnormal power-down, power-down of most of power supplies and signals is uncontrollable, and even output voltages Vout of part of DC power supplies may overshoot abnormally, as shown in FIGS. 1 and 2. A main cause for the abnormal overshoot of the voltage in case of abnormal power-down of the PSU is that, in internal designs of some DC power chips, a power-down speed of an involved power end VCC is higher than that of an enable end. As a result, there is brought an abnormality in the power chip, and the output voltage overshoots abnormally first and then drops. When an overshoot amplitude of the output voltage is relatively high, there may be a risk that a component of the main board or the chip is burned out.

SUMMARY

The embodiments of the present disclosure provide a sequence control circuit for enhancing reliability in case of abnormal power-down and a control method thereof. An enable end of a DC power supply of a board is controlled to switch an enable signal from a high-level state to a low-level state immediately in case of abnormal power-down, thereby solving the problem of output voltage overshoot.

In order to achieve the above objective, the present disclosure discloses the following technical solutions.

An aspect of the present disclosure provides a sequence control circuit for enhancing reliability in case of abnormal power-down, including a signal indication circuit, a control/isolation circuit, and an energy storage circuit.

The signal indication circuit is a logic AND gate circuit, has an input end connected to multiple paths of power-down monitoring signals and an output end connected to an input end of the control/isolation circuit, and when a level of any path of power-down monitoring signal is low, outputs a low level to the control/isolation circuit.

An output end of the control/isolation circuit is connected to an enable end of a DC power chip, and the control/isolation circuit controls and isolates an output signal of the signal indication circuit by means of two-stage Metal-Oxide-Semiconductor (MOS) transistors.

An output end of the energy storage circuit is connected to the control/isolation circuit to provide reserve power for operation of the two-stage MOS transistors of the control/isolation circuit.

Preferably, the signal indication circuit is an AND gate circuit consisting of two or more diodes. The input end of the signal indication circuit is connected to the multiple paths of power-down monitoring signals, and in response to the level of any path of monitoring signal being low, the control/isolation circuit of next stage is started immediately, thereby avoiding a condition that the sequence control circuit cannot be started effectively due to relatively slow power-down of a single monitoring signal in case of abnormal power-down.

Further, the control/isolation circuit includes a first MOS transistor and a second MOS transistor. A source of the first MOS transistor is connected with the enable end of the DC power chip, while a gate of the first MOS transistor is connected with a source of the second MOS transistor. A gate of the second MOS transistor is connected with an anode of the diode. The control/isolation circuit further includes a 3.3V power supply, as well as a first pull-up resistor and second pull-up resistor that are correspondingly adapted to the first MOS transistor and the second MOS transistor respectively. When a level of a power-down monitoring signal is low, a signal of the enable end of the DC power chip may be pulled down rapidly by two-stage reversion of the second MOS transistor and first MOS transistor, and two adjacent control signals may be isolated effectively by two-stage MOS control, thereby avoiding interferences between the two signals.

Further, the energy storage circuit includes a diode and a capacitor. An anode of the diode is connected with the 3.3V power supply, and a cathode of the diode is connected with a capacitor as well as an end of each of the first pull-up resistor and the second pull-up resistor. In case of power-down of the 3.3V power supply, energy stored by the capacitor may ensure operation of the first MOS transistor and the second MOS transistor for long enough, thereby ensuring that the signal of the enable end of the DC power chip remains pulled down.

Another aspect of the present disclosure provides a control method for controlling the above-mentioned sequence control circuit for enhancing reliability in case of abnormal power-down, including following steps:

selecting multiple paths of power-down monitoring signals of a power controller as input signals;

performing a logic AND operation on the multiple paths of input signals by means of a diode AND gate, outputting a signal to two-stage MOS transistors for signal control and isolation, and then outputting a signal to an enable end of a DC power chip; and providing reserve power for the two-stage MOS transistors by means of a capacitive energy storage power supply so as to maintain operation of the two-stage MOS transistors after power-down.

Preferably, in the control method, the power-down monitoring signals of the power controller use a Power OK end output signal and a Power good end output signal.

Further, the MOS transistor is an N-type MOS transistor, and each MOS transistor is correspondingly provided with a power supply and a pull-up resistor.

The effects provided in SUMMARY are not all effects of the present disclosure but only effects of the embodiments. One of the above technical solutions has the following advantages or beneficial effects.

According to the sequence control circuit for enhancing reliability in case of abnormal power-down and control method thereof in the embodiments of the present application, multiple paths of power-down monitoring signals of a power controller are selected as input signals. Then, a logic AND operation is performed on the multiple paths of input signals by means of a diode AND gate, the signal is output to two-stage MOS transistors for signal control and isolation, and then the signal is output to an enable end of a DC power chip. An energy storage power supply provides reserve power for the MOS transistors so as to maintain operation thereof. In the embodiments, the multiple paths of power-down monitoring signals are selected as input signals, and when a level of any path of input signal is low, the control/isolation circuit of the next stage is started immediately, thereby ensuring that the sequence control circuit is started rapidly and effectively. The input signals are reversely controlled and isolated by means of the two-stage MOS transistors, whereby interferences between two adjacent signals are avoided. In order to ensure normal operation of the control/isolation circuit after power-down of a board, a capacitive energy storage power supply is arranged to power the MOS transistors to ensure that a signal of the enable end of the DC power chip remains pulled down. According to the present disclosure, the problem of output voltage overshoot caused by a power-down sequence of the power supply end and enable end of the DC power chip in case of abnormal power-down of a board is effectively solved, and the problem of component damage caused by the overshoot voltage is solved.

BRIEF DESCRIPTION OF THE DRAWINGS

The drawings, which are incorporated in and constitute a part of the specification, illustrate embodiments consistent with the present application and, together with the specification, serve to explain the principle of the present application.

DETAILED DESCRIPTION

In order to make the technical solutions in the present disclosure understood better by those skilled in the art, the technical solutions in the embodiments of the present disclosure will be described clearly and completely in combination with the drawings in the embodiments of the present disclosure. Clearly, the described embodiments are not all but merely some of the embodiments of the present disclosure. All other embodiments obtained by those ordinarily skilled in the art based on the embodiments in the present disclosure without creative work shall fall within the scope of protection of the present disclosure.

For ease of understanding the embodiments, abbreviations and key terms involved in the embodiments will now be explained and described.

PSU: Power Supply Unit.

MOS: Metal-Oxide-Semiconductor, an abbreviation of MOSFET, field effect transistor.

DC: Direct Current.

Figure 1:
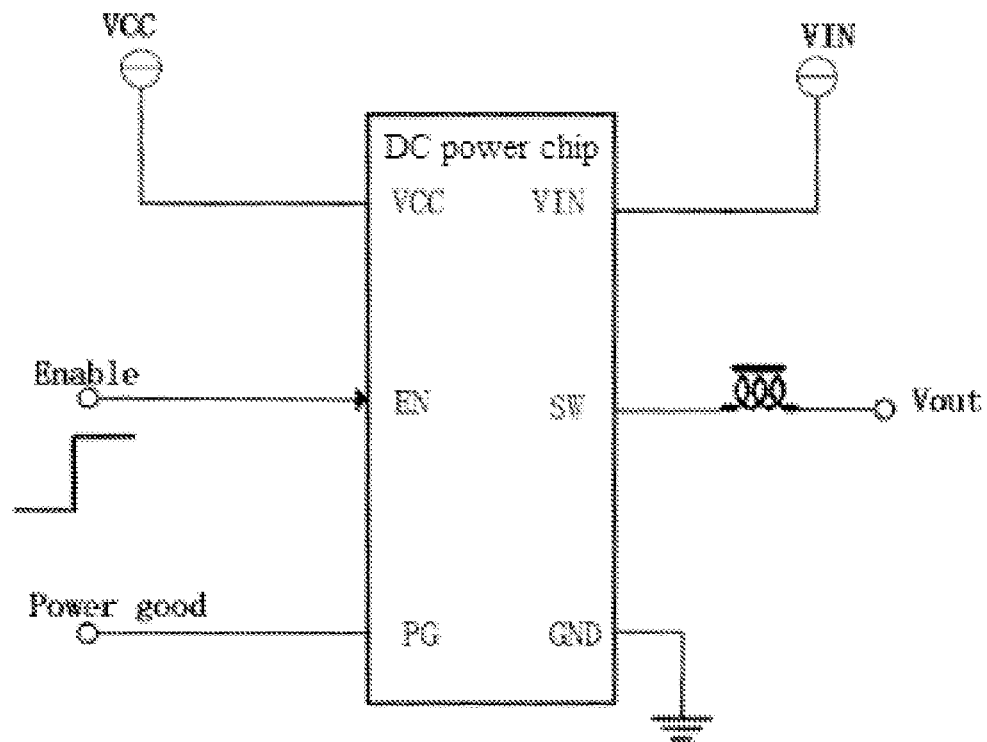
FIG. 1 is a schematic diagram of an existing DC power chip.
Figure 2:
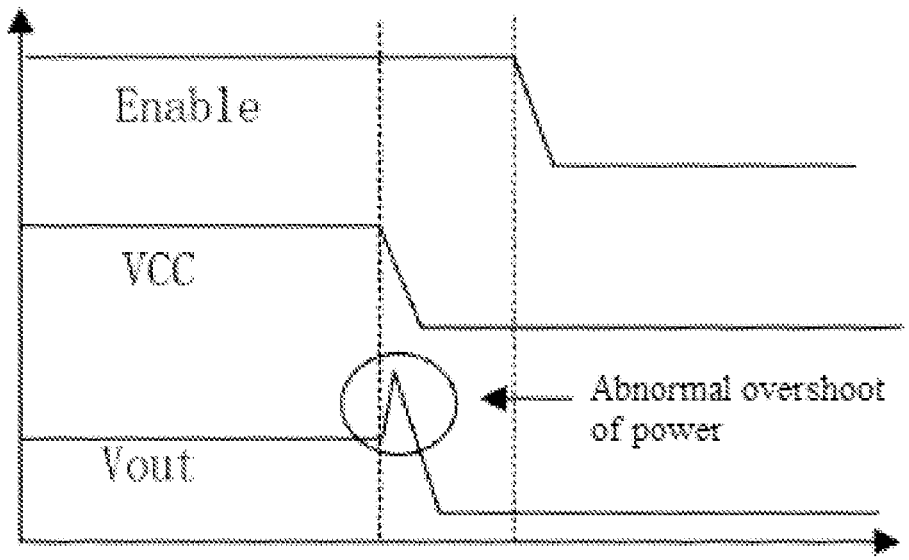
FIG. 2 is an overshoot sequence diagram of an output voltage of a DC power supply in case of abnormal power-down of an existing PSU.
Figure 3:
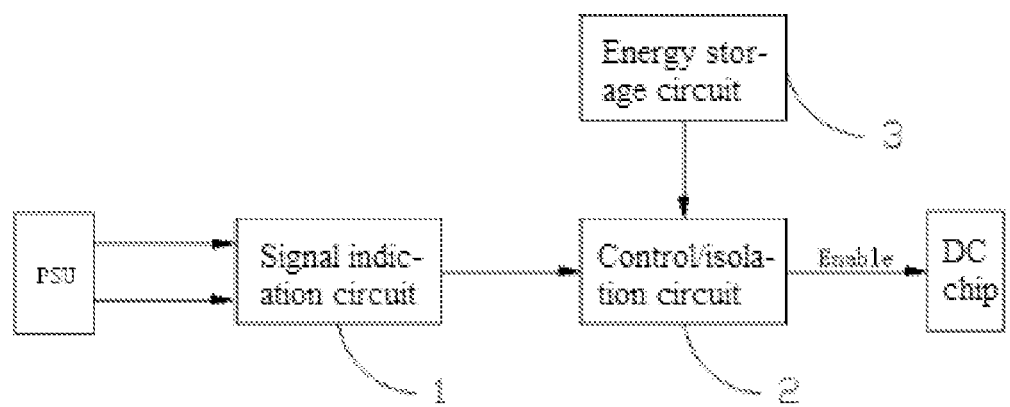
FIG. 3 is a schematic structural diagram of a sequence control circuit for enhancing reliability in case of abnormal power-down according to an embodiment of the present application.
Figure 4:
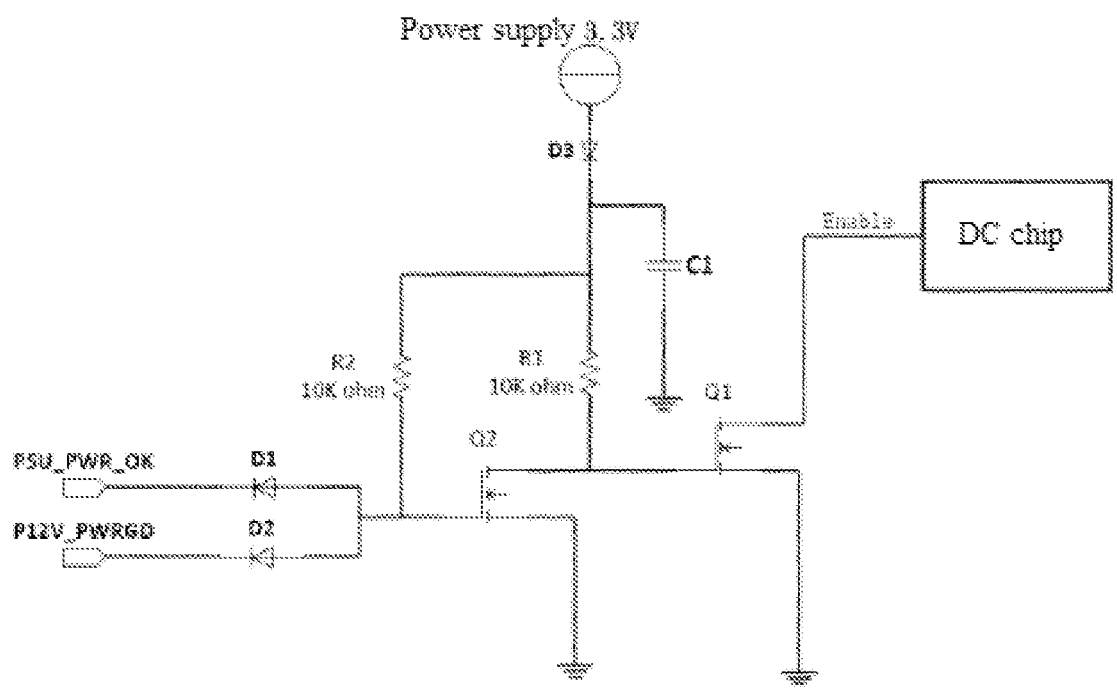
FIG. 4 is a circuit diagram of the sequence control circuit for enhancing reliability in case of abnormal power-down in FIG. 3.

FIG. 3 is a schematic structural diagram of a sequence control circuit for enhancing reliability in case of abnormal power-down according to an embodiment of the present application. FIG. 4 is a specific circuit diagram of the sequence control circuit in FIG. 3.

As shown in FIGS. 3 and 4, the sequence control circuit of the present embodiment includes a signal indication circuit 1, a control/isolation circuit 2, and an energy storage circuit 3.

The signal indication circuit 1 is a logic AND gate circuit, has an input end connected to multiple paths of power-down monitoring signals of a PSU and an output end connected to an input end of the control/isolation circuit, and when a level of any path of power-down monitoring signal is low, outputs a low level to the control/isolation circuit.

An output end of the control/isolation circuit 2 is connected to an enable end of a DC power chip, and the control/isolation circuit controls and isolates an output signal of the signal indication circuit by means of two-stage MOS transistors.

An output end of the energy storage circuit 3 is connected to the control/isolation circuit to provide reserve power for operation of the two-stage MOS transistors of the control/isolation circuit.

Specifically, the signal indication circuit 1 is an AND gate circuit consisting of two or more diodes. The input end of the signal indication circuit 1 is connected to the multiple paths of power-down monitoring signals, and when a level of any path of monitoring signal is low, the control/isolation circuit of the next stage is started immediately, thereby avoiding the condition that the sequence control circuit cannot be started effectively due to relatively slow power-down of a single monitoring signal in case of abnormal power-down. In the present embodiment, the logic AND gate circuit consists of diodes D1 and D2, and correspondingly, the monitoring signals use a Power OK end signal PSU_PWR_OK of the PSU and a Power good end signal P12V_PWRGD of a hot-swap circuit of a main board. The PSU_PWR_OK signal is an output state indicator of the PSU. When the PSU outputs a normal voltage of 12V, a level of the PSU_PWR_OK signal changes to a high level. When an output voltage of the PSU drops below an output threshold, the level of the PSU_PWR_OK signal changes to a low level. In case of power-down of the PSU, the level of the PSU_PWR_OK signal changes to a low level. The P12V_PWRGD signal is a signal of the hot-swap circuit of the main board. When the PSU outputs a 12V voltage to the main board, the 12V voltage is converted into P12V by the hot-swap circuit to power other DC power supplies on the main board. When the P12V voltage rises to be above a threshold, a level of the P12V_PWRGD signal changes to a high level. When P12V drops below the threshold, the level of P12V_PWRGD changes to a low level. In case of power-down of the PSU, P12V drops to be below the threshold, and the level of P12V_PWRGD changes to a low level. The PSU_PWR_OK and P12V_PWRGD signals are two indication signals powered down first during power drop after power-down of the PSU, whereby it is ensured that the control/isolation circuit is started immediately in case of abnormal power-down and an Enable signal of the DC power supply is pulled down rapidly.

Further, as shown in FIG. 4, the control/isolation circuit 2 includes a first MOS transistor Q1 and a second MOS transistor Q2. A source of the first MOS transistor is connected with the enable end of the DC power chip, while a gate of the first MOS transistor is connected with a source of the second MOS transistor. A gate of the second MOS transistor is connected with an anode of the diode. The control/isolation circuit 2 includes a 3.3V power supply, as well as a first pull-up resistor R1 and second pull-up resistor R2 that are correspondingly adapted to the first MOS transistor and the second MOS transistor respectively. When a level of a power-down monitoring signal is low, a signal of the enable end of the DC power chip may be pulled down rapidly by two-stage reversion of the second MOS transistor and first MOS transistor, and two adjacent control signals may be isolated effectively under the control of the two-stage MOS transistors, thereby avoiding interferences between the two signals.

Figure 5:
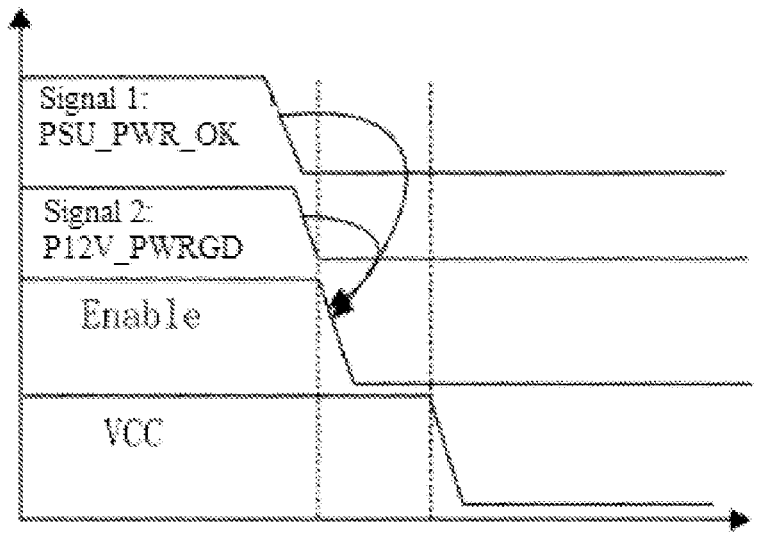
FIG. 5 is a sequence diagram of an output voltage of a DC power supply in case of abnormal power-down of a PSU according to an embodiment of the present application.

More specifically, the energy storage circuit 3 includes a diode D3 and a capacitor C1. An anode of the diode is connected with the 3.3V power supply, and a cathode of the diode is connected with a capacitor as well as an end of each of the first pull-up resistor and the second pull-up resistor. In case of power-down of the 3.3V power supply, energy stored by the capacitor may ensure operation of the first MOS transistor and the second MOS transistor for long enough, thereby ensuring that the signal of the enable end of the DC power chip remains pulled down. Capacitance of C1 may be selected according to power-down time of the main board. If the power-down time is longer, the capacitance of C1 is correspondingly higher. It is to be noted that, in this design, resistance of R1 and R2 and the capacitance of C1 are adjusted as practically required to ensure that the sequence control circuit may operate till power of the main board drops below a safe voltage in case of power-down of the PSU. FIG. 5 is a sequence diagram of an output voltage of the DC power supply in case of abnormal power-down of the PSU after the sequence control circuit provided in the embodiment of the present application is used.

Figure 6:
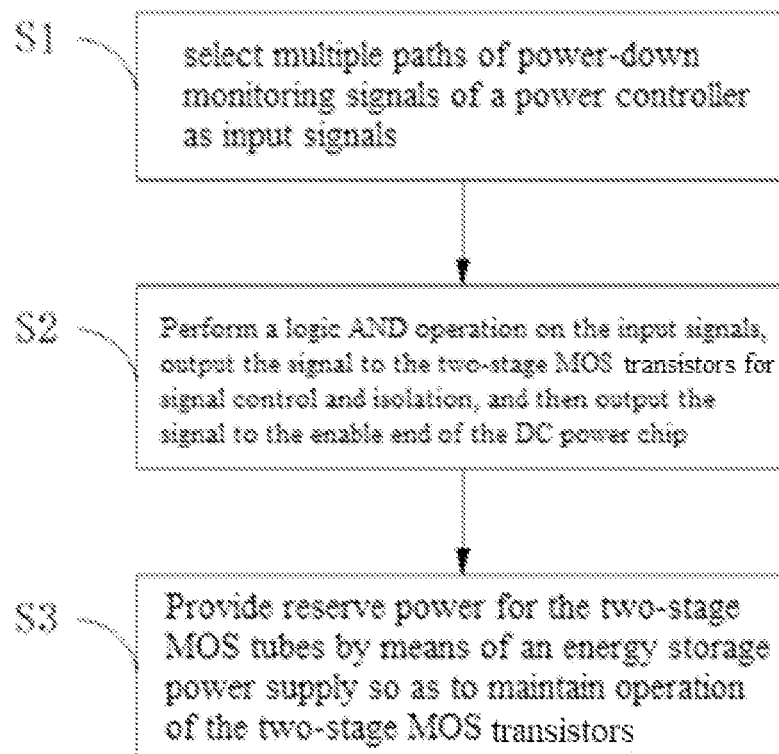
FIG. 6 is a flowchart of a sequence control method for enhancing reliability in case of abnormal power-down according to an embodiment of the present application.

FIG. 6 is a flowchart of a sequence control method for enhancing reliability in case of abnormal power-down according to an embodiment of the present application. The control method is used to control the above-mentioned sequence control circuit for enhancing reliability in case of abnormal power-down. The method includes the following steps.

In S1, multiple paths of power-down monitoring signals of a power controller are selected as input signals.

In S2, a logic AND operation is performed on the multiple paths of input signals by means of a diode AND gate, the signal is output to the two-stage MOS transistors for signal control and isolation, and then the signal is output to the enable end of the DC power chip.

In S3, reserve power is provided for the two-stage MOS transistors by means of a capacitive energy storage power supply so as to maintain operation of the two-stage MOS transistors after power-down.

In the control method, the MOS transistor is an N-type MOS transistor. The control method has the same technical effects as the sequence control circuit provided in the above-mentioned embodiment.

According to the sequence control circuit for enhancing reliability in case of abnormal power-down and control method in the embodiments, the two signals powered down first in case of power-down of the PSU are selected as power-down monitoring signals, and a logic AND circuit design is used, whereby it is ensured that the control/isolation circuit of the next stage is started immediately when a level of any monitoring signal is low. The input signals are reversely controlled and isolated by means of the MOS transistors of the two stages, whereby interferences between two adjacent signals are avoided. The energy storage power supply consisting of the diode and the capacitor ensures that the control/isolation circuit operates for long enough until power-down of the main board is completed. With the solutions of the embodiments, the signal of the enable end of the DC power chip is switched from a high-level state to a low-level state immediately in case of abnormal power-down, thereby solving the problem of output voltage overshoot caused by a power-down sequence of the power supply end and the enable end and preventing chip or component damage caused by the overshoot voltage.

The above is only the preferred embodiment of the present disclosure and not intended to limit the present disclosure. Any modifications, improvements, equivalent replacements, etc., made by those skilled in the art without departing from the principle of the present disclosure shall fall within the scope of protection of the present disclosure.

What is claimed is:

1. A sequence control circuit for enhancing reliability in case of abnormal power-down, comprising a signal indication circuit, a control/isolation circuit, and an energy storage circuit, wherein
    the signal indication circuit is a logic AND gate circuit, has an input end connected to multiple paths of power-down monitoring signals and an output end connected to an input end of the control/isolation circuit, and when a level of any path of a power-down monitoring signal is low, outputs a low level to the control/isolation circuit;
    an output end of the control/isolation circuit is connected to an enable end of a Direct Current (DC) power chip, and the control/isolation circuit controls and isolates an output signal of the signal indication circuit by means of two Metal-Oxide-Semiconductor (MOS) transistors; and
    an output end of the energy storage circuit is connected to the control/isolation circuit to provide reserve power for the two MOS transistors of the control/isolation circuit.

2. The sequence control circuit for enhancing reliability in case of abnormal power-down according to claim 1, wherein the signal indication circuit is an AND gate circuit comprising two or more diodes.

3. The sequence control circuit for enhancing reliability in case of abnormal power-down according to claim 2, wherein the two MOS transistors comprise a first MOS transistor and a second MOS transistor, wherein a source of the first MOS transistor is connected with the enable end of the DC power chip, while a gate of the first MOS transistor is connected with a source of the second MOS transistor; and a gate of the second MOS transistor is connected with anodes of the two or more diodes.

4. The sequence control circuit for enhancing reliability in case of abnormal power-down according to claim 3, wherein the control/isolation circuit further comprises a power supply, as well as a first pull-up resistor and a second pull-up resistor that correspond to the first MOS transistor and the second MOS transistor respectively.

5. The sequence control circuit for enhancing reliability in case of abnormal power-down according to claim 4, wherein the energy storage circuit comprises a diode and a capacitor, wherein the anodes of the two or more diodes of the AND gate circuit are connected with the power supply, and cathodes of the two or more diodes of the energy storage circuit are connected with the capacitor as well as an end of each of the first pull-up resistor and the second pull-up resistor.

6. The sequence control circuit for enhancing reliability in case of abnormal power-down according to claim 5, wherein a voltage of the power supply is 3.3V.

7. A control method of a sequence control circuit for enhancing reliability in case of abnormal power-down, being applied to the sequence control circuit according to claim 1, the control method comprising the following steps:
    selecting the multiple paths of power-down monitoring signals of a power controller as input signals;
    performing a logic AND operation on the multiple paths of input signals by means of a diode AND gate, outputting a signal to two-stage MOS transistors for signal control and isolation, and then outputting a signal to the enable end of the DC power chip; and
    providing reserve power for the two-stage MOS transistors by means of a capacitive energy storage power supply so as to maintain operation of the two-stage MOS transistors after power-down.

8. The control method of a sequence control circuit for enhancing reliability in case of abnormal power-down according to claim 7, wherein the power-down monitoring signals of the power controller use a Power OK end output signal and a Power good end output signal.

9. The control method of a sequence control circuit for enhancing reliability in case of abnormal power-down according to claim 7, wherein the two-stage MOS transistors are N-type MOS transistors, and each of the two-stage MOS transistors is correspondingly provided with a power supply and a pull-up resistor.

10. The sequence control circuit for enhancing reliability in case of abnormal power-down according to claim 1, wherein the power-down monitoring signals use a Power OK end signal (PSU_PWR_OK signal) of a power supply unit (PSU) and a Power good end signal (P12V_PWRGD signal) of a hot-swap circuit of a main board.

11. The sequence control circuit for enhancing reliability in case of abnormal power-down according to claim 10, wherein a level of the PSU_PWR_OK signal changes to a high level in response to the PSU outputting a normal voltage of 12V.

12. The sequence control circuit for enhancing reliability in case of abnormal power-down according to claim 10, wherein a level of the PSU_PWR_OK signal changes to a low level in response to an output voltage of the PSU dropping below an output threshold.

13. The sequence control circuit for enhancing reliability in case of abnormal power-down according to claim 12, wherein the level of the PSU_PWR_OK signal changes to the low level in response to power-down of the PSU.

14. The sequence control circuit for enhancing reliability in case of abnormal power-down according to claim 10, wherein a 12V voltage is converted into a P12V voltage by the hot-swap circuit to power other DC power supplies on the main board in response to the PSU outputting the 12V voltage to the main board.

15. The sequence control circuit for enhancing reliability in case of abnormal power-down according to claim 14, wherein a level of the P12V_PWRGD signal changes to a high level in response to the P12V voltage rising to be above a threshold.

16. The sequence control circuit for enhancing reliability in case of abnormal power-down according to claim 14, wherein a level of P12V_PWRGD signal changes to a low level in response to the P12V voltage dropping below a threshold.

17. The sequence control circuit for enhancing reliability in case of abnormal power-down according to claim 14, wherein the P12V voltage drops to be below a threshold, and a level of P12V_PWRGD signal changes to a low level in response to power-down of the PSU.

18. The sequence control circuit for enhancing reliability in case of abnormal power-down according to claim 3, wherein in response to a level of a power-down monitoring signal being low, a signal of the enable end of the DC power chip is configured to be pulled down by two-stage reversion of the second MOS transistor and first MOS transistor, and two adjacent control signals are configured to be isolated under control of two-stage MOS transistors.

19. The sequence control circuit for enhancing reliability in case of abnormal power-down according to claim 5, wherein an anode of the diode of the energy storage circuit is connected with a 3.3V power supply.

20. The sequence control circuit for enhancing reliability in case of abnormal power-down according to claim 5, wherein a capacitance of the capacitor is selected according to power-down time of a main board.

* * * * *